United States Patent

[11] 3,564,293

[72] Inventor John E. Mungenast
Skaneateles, N.Y.
[21] Appl. No. 721,698
[22] Filed Apr. 16, 1968
[45] Patented Feb. 16, 1971
[73] Assignee Power Semiconductors, Inc.
Devon, Conn.

[54] TEMPERATURE-COMPENSATING THYRISTOR CONTROL
13 Claims, 7 Drawing Figs.

[52] U.S. Cl. .......... 307/252, 307/117; 317/40, 317/41; 323/19, 323/68; 307/310
[51] Int. Cl. .......... H03k 17/00
[50] Field of Search .......... 307/117, 252, 284, 305; 317/40, 41; 323/19, 68

[56] References Cited
UNITED STATES PATENTS

| | | | |
|---|---|---|---|
| 2,998,547 | 8/1961 | Berman | 307/252 |
| 3,183,425 | 5/1965 | Slowson | 307/252 |
| 3,225,280 | 12/1965 | Happe et al. | 307/252 |
| 3,249,929 | 5/1966 | Sillers | 307/252 |
| 3,252,010 | 5/1966 | Buttenhoff | 307/252 |
| 3,278,823 | 10/1966 | Ross | 307/252 |
| 3,293,533 | 12/1966 | Covert | 307/252 |
| 3,296,515 | 1/1967 | Knauth | 307/252 |
| 3,371,231 | 2/1968 | Burley | 307/252 |
| 3,421,027 | 1/1969 | Maynard et al. | 307/252 |

*Primary Examiner*—Donald D. Forrer
*Assistant Examiner*—J. D. Frew
*Attorney*—James and Franklin

ABSTRACT: A temperature-sensing element is mounted in good heat transfer relation with a thyristor, and is connected to a control winding of the thyristor firing control circuit. When the temperature of the thyristor rises too high for existing operating conditions the sensing element is effective to reduce the current flow in the thyristor, without stopping it altogether. A signal derived from the current flow through the thyristor may be combined with a signal from the temperature-sensing means to provide a control more accurately representative of the junction temperature in the thyristor. The control is continuous over a predetermined temperature range.

INVENTOR
JOHN E. MUNGENAST
BY James and Franklin
ATTORNEYS

INVENTOR
JOHN E. MUNGENAST
BY James and Franklin
ATTORNEYS

TEMPERATURE-COMPENSATING THYRISTOR CONTROL

This invention relates to automatic control of semiconductor switching devices such as thyristors (or silicon-controlled rectifiers — SCR's, as they are sometimes called) in response to the temperature of the switching device itself.

The thyristor has found widespread acceptance as a switching element replacing thyratrons, relays, vacuum tubes, etc., in many types of control circuits as a result of the improved reliability, speed of response, relatively low cost and size, and accuracy of control which characterize thyristors.

The thyristor may be considered as a three-element semiconductor device in which the current will flow only from the anode to the cathode terminal but not in the opposite direction, and the unidirectional flow si initiated by the signal applied to the gate terminal. An alternating voltage may be applied between the anode and cathode (load) terminals. Current flow through the thyristor will occur, however, only when a forward bias is applied across the anode and cathode, and even then only after a signal of the proper magnitude and polarity has been applied at the gate terminal. That is to say, even when the load terminals are forward biased, the thyristor will remain in the "off" or nonconductive condition until the signal applied at the gate is of the proper magnitude and polarity. Thereafter the thyristor will be in the "on" or conductive condition and will remain on, even if the gate signal is removed, until the forward bias across the anode and cathode is removed. Thereafter it will remain off until both forward bias and the gate signal are again simultaneously present.

Thus, when an alternating or fluctuating voltage is applied across the anode and cathode of a thyristor, that current varying cyclically between conditions in which operative forward bias is and is not applied to the device, thereby rendering the device respectively potentially conductive and actually nonconductive, the moment during each period of potential conductivity when the device becomes actually conductive will be determined by the moment when the gate is appropriately energized. By varying the phase of the gate signal relative to the forward-biasing signal applied to the load terminals, the duration of the "on" times of the device relative to the "off" times thereof can be varied. This will, in turn, vary the average current passing through the thyristor.

Typical examples of loads utilized in conjunction with thyristor-controlled circuits include electroplating baths, fluorescent lamps, heaters, battery chargers and machine-controlling motors. In each system utilizing thyristor current control, the thyristor passes current only during predetermined time intervals, the average or RMS value of the current being effectively determined by the timing of the operative control signal applied to the thyristor gate terminal.

It is common practice to regulate the load current by feeding back a signal derived from the load current or voltage to a firing circuit which, in turn, modifies the gate control signal in response to load conditions. In this manner, the current or voltage applied to the load by the thyristor is maintained at a desired level, any variations therefrom being corrected by a corresponding variation in the gate control signal.

During the operation of a thyristor, heat is generated at the junctions between the semiconductor wafers or layers which make up the device. The heating is primarily caused by the forward voltage drop during load current conduction and forward leakage current when forward conduction is blocked. The heating causes an increase in the junction temperature. The junction temperature must be maintained within a safe temperature range, i.e., below a critical operating temperature above which the thyristor will be irreversibly damaged. The critical temperature of the thyristor case, corresponding to the junction temperature, will, however, vary with the average amount of current flowing (the greater the current the lower the limit) and with the relative time duration of the "on" and "off" periods (the greater the "on" time the higher the limit for a given average current).

In recent years, thyristor control circuits have been called upon to deliver comparatively large load currents. As a result of such increased current demands, the increased heating of the thyristor during forward conduction has necessitated the use of heat dissipating elements such as heat sinks. It has been found that in many applications, a heat sink is not able alone to dissipate a sufficient amount of heat to maintain the junction temperature within safe levels. The use of forced air or water cooling of the heat sink and thyristor has therefore been resorted to to increase the amount of heat dissipation and thereby to maintain the junction temperature at a safe operative level. However, even with these added precautions, the junction temperature of the thyristor may reach an excessively high value due to an increase in the ambient temperature or a failure in the cooling system.

It is known to place an over-temperature thermostat on the heat sink to sense the temperature at the heat sink, and to cause a complete turnoff of the control circuit when overheating occurs. In many applications of thyristor control circuits, however, it is highly advantageous to be able merely to reduce the load current, thereby reducing the thyristor junction temperature to a safe level without requiring the complete turnoff of the equipment.

Thus, for example, in electroplating applications, where the deposition of metal is a function of both the plating current and time, it is far more economical to operate the plating process at a reduced current and to increase the required plating time, than to completely shut off the plating equipment while the cause of the overheating is found and remedied. The cause for the overheating of the thyristor may thus be located and remedied while the plating system continues to operate. The same considerations apply in many other applications of thyristor control circuits.

It is, therefore, a prime object of the present invention to provide a thyristor control circuit where the circuit may continue to operate at a reduced level even when the temperature of the semiconductor device rises unduly.

It is a further object of the present invention to provide a control circuit in which the output current is automatically reduced to a safe value when the operating temperature of the switching device rises.

It is another object of this invention to provide a thyristor control circuit in which complete turn off is not necessary even when the thyristor operating temperature exceeds a predetermined level relative to the then existing operating conditions.

It is still a further object of the present invention to provide a thyristor control circuit in which an indication is given when the output load current is reduced to compensate for excessive heating of the thyristor.

It is a further object of the present invention to provide a thyristor control circuit in which the thyristor current is sensed along with the thyristor temperature to derive a signal more closely representative of actual thyristor junction temperature, and to vary the thyristor current flow in accordance with that signal.

It is still another object of the present invention to provide a thyristor control circuit in which the output current is reduced when junction overheating occurs, and returns to its normal value when the junction is no longer overheated.

It is yet a further object of the present invention to provide a thyristor control circuit in which the equilibrium load current is automatically set to the highest value compatible with heat sink and ambient temperature conditions.

It is also an object of the present invention to provide a thyristor control circuit in which at safe temperatures the conduction angle is primarily controlled by the load feedback input, and at temperatures exceeding a predetermined value, control of the conduction angle is taken over by an input proportional to the thyristor temperature.

To these ends, the present invention provides a thyristor control circuit in which a temperature sensing element is mounted in good heat transfer relation with the semiconductor wafer junction. The temperature sensing element is operatively connected to the firing control circuit for the semiconductor circuit so as to gradually assume control of the latter to vary the gate control signal, and thus the forward current flow in the thyristor, only when the sensed temperature corresponds to a junction temperature exceeding the safe operating temperature for the thyristor under then existing operating conditions.

The temperature sensing element, as here specifically disclosed, is a temperature-sensitive resistance element, such as a thermistor, which is mounted on the case or housing of the thyristor as near to the wafers as possible. When the sensed temperature exceeds a predetermined maximum safe level, a DC signal related to the resistance of the thermistor is coupled to one control winding of a saturable reactor provided in the firing control circuit. This signal, corresponding to the temperature of the thyristor, effectively reduces the forward current flow by decreasing the conduction angle, thereby to tend to reduce the thyristor junction temperature.

The thermistor, for practical reasons, is only able to measure case or housing temperature, rather than the actual wafer junction temperature, but the latter is the temperature of real interest. To obtain a closer approximation of the junction temperature, a signal corresponding to the thyristor forward current is also coupled to the firing control circuit to work with the thyristor temperature signal in controlling the gate control signal. That current signal is best made representative of the rms or effective heating value of the forward current.

If, for any reason, such as a malfunction of the cooling system or a sudden increase in the ambient temperature, the junction temperature increases to an unsafe level, this temperature rise will be sensed. If the temperature is above the maximum safe value for any and all operating conditions, the thyristor will be turned off, but if the temperature is unsafe for existing current and conduction angle values, the thyristor is not turned off. Instead the temperature signal gradually assumes control, and the conduction angle is reduced, lowering the average current. This diminished load current will result in decreased thyristor temperature, the current will tend to rise, and an equilibrium level of forward current will be reached at the highest safe load current compatible with thyristor temperature conditions. If the cause of cooling system deterioration is remedied, the thyristor temperature will drop. This will be sensed, and load current will be increased to where the normal control system will once again take charge.

The thyristor will therefore continue to provide load current, albeit at a reduced level, even when the junction temperature is increased to a level unsafe for full current output. The need for completely cutting off the load current, except under the most extreme circumstances, is eliminated and the operation of the load is allowed to continue. In a control circuit comprising both a heat sink and external forced air or liquid cooling, the circuit can continue to operate at a reduced load current, compatible to the heat dissipation provided by the heat sink alone, if the external cooling is interrupted. The circuit also functions where external cooling is not provided in the first instance.

If desired an indicator such as a meter and/or alarm bell or light may be operatively connected to the firing control circuit to provide a warning to the operator that the system is working at a reduced load current level due to an excessive thyristor junction temperature. This indication enables the operator to adjust other aspects of the operation to compensate for the reduction of load current, as well as to search for and remedy the function in the cooling system.

To the accomplishment of the above, and to such other objects as may hereinafter appear, the present invention relates to a control circuit as defined in the appended claims and as described in this specification, taken together with the accompanying drawings in which:

Figure 1:
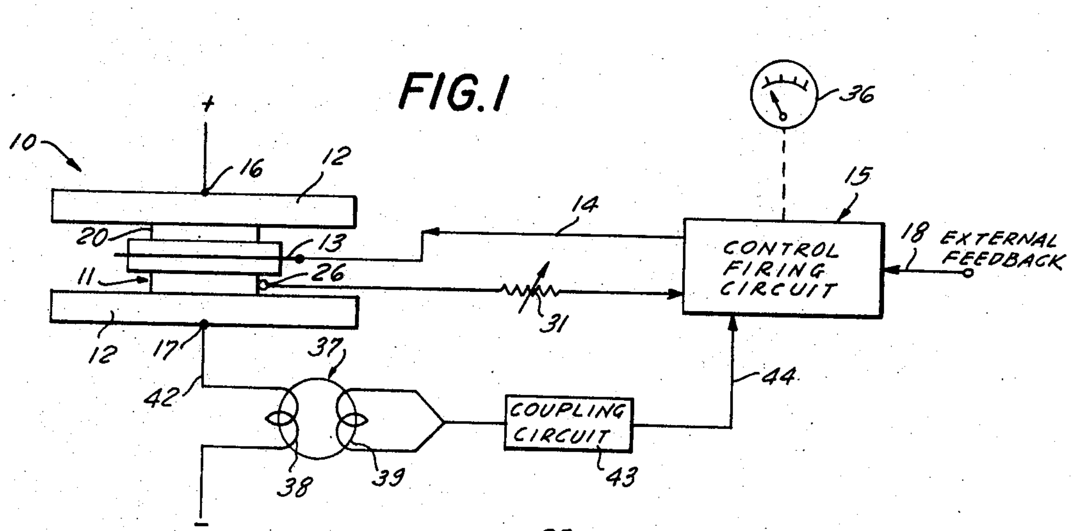
FIG. 1 is a schematic diagram of a control circuit illustrating one embodiment of the present invention.
Figure 6A:
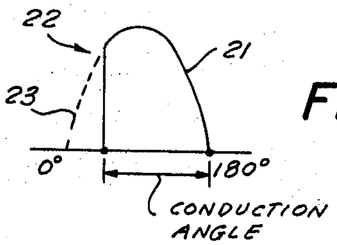
FIG. 6*a* illustrates a typical current-time relationship in a thyristor during the positive half-cycle of the supply voltage.

The control circuit shown in FIG. 1 comprises a semiconductor switching device generally designated 10 in the form of a housed thyristor or SCR 11 mounted in electrically conducting relation between a pair of upper and lower heat sinks 12. An alternating supply voltage is applied directly to the heat sinks 12 as at 16 and 17, and thus across the anode and cathode terminals of thyristor 11. The semiconductor wafer material of thyristor 11 is housed within a thermally conducting housing or case 20. A control signal is applied to the gate terminal 13 of thyristor 11 through conductor 14 thereby to tend to maintain that output parameter at a predetermined value, said signal being derived from a control firing circuit designated generally at 15. Control firing circuit 15 receives a feedback signal 18 in response to an output parameter such as voltage. The circuit so far described is well known, as is the manner in which the firing circuit 15, in response to the feedback signal 18 from the load, produces a gate control signal which varies the conduction or firing angle of the thyristor, and thus the forward conduction or load current between the cathode and anode of the thyristor 11. The conduction angle is defined as that portion of the time of potential conductivity of the thyristor (when the load terminals are forward biased) during which forward conduction actually occurs. As illustrated in FIG. 6*a* forward conduction will occur through thyristor 11 only during the solid line portion 21 of the positive half-cycle 22 of the supply voltage. During the dotted line portion 23, no forward current will flow between the flow terminals of thyristor 11. The conduction angle may thus be defined as the phase of the positive half-cycle during which forward current is present.

Upon the presence of forward conduction current in thyristor 11, the junction temperature will increase in proportion to the average value of the forward current. The amount of forward current is in turn determined by the phase of the gate control signal derived from firing circuit 15.

Figures 5, 6:
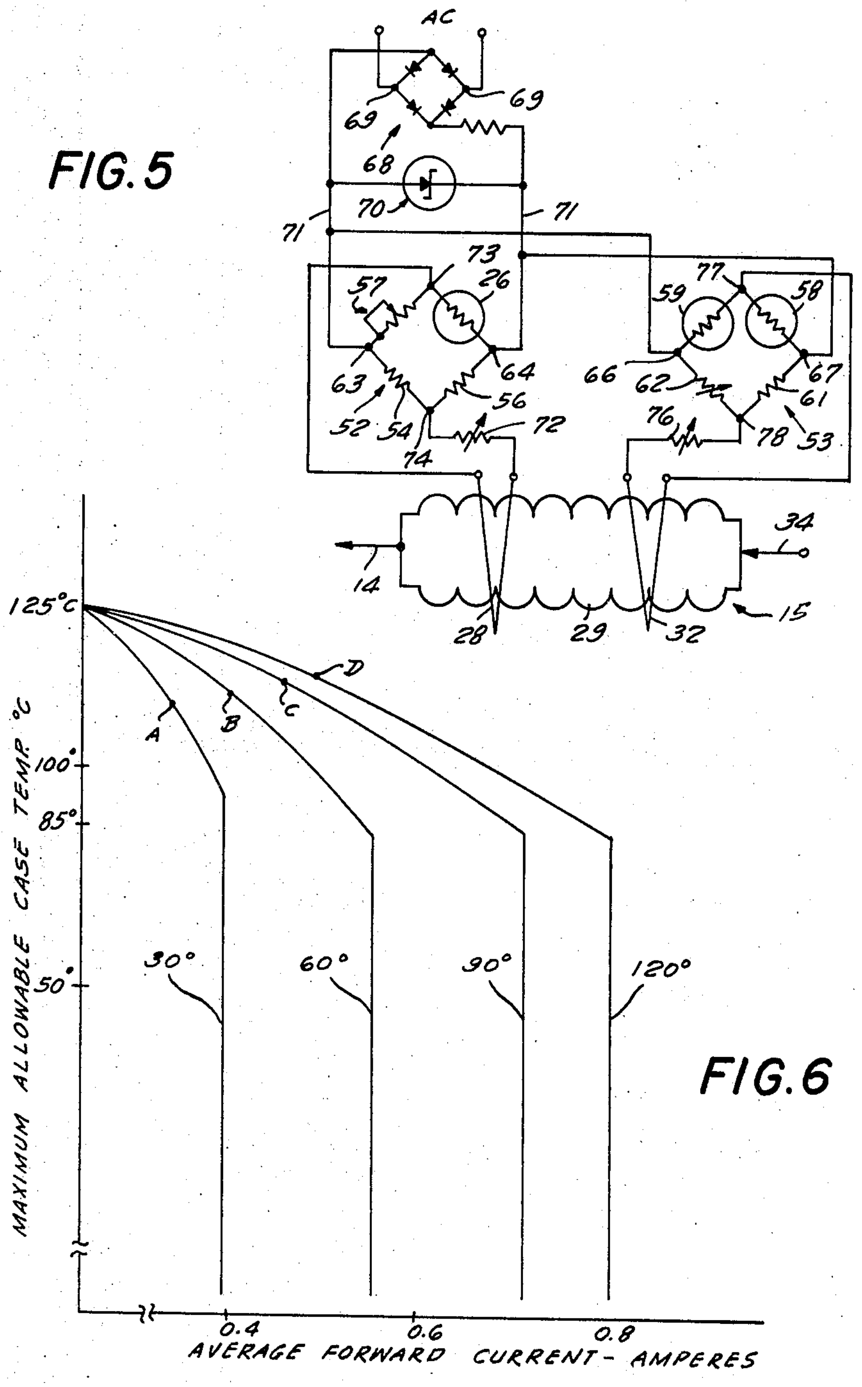
FIG. 5 is a circuit diagram illustrating another embodiment of the present invention.
FIG. 6 is a graphical plot of average forward current and maximum case temperature of an exemplary thyristor for several values of conduction or firing angles.

FIG. 6 is a graphical representation, for a typical system, of the maximum allowable case temperature as a function of the average value of the forward current for a typical thyristor in which the absolute maximum junction temperature is 125° C. Four curves A—D are illustrated, each corresponding to a particular conduction angle. For each value of the conduction angle there is a family of critical temperatures for different values of average current above which it is dangerous to operate the thyristor 11, and below which the thyristor may be safely operated. As seen in FIG. 6 these families of critical temperature levels are indicated respectively by the curves designated A, B, C, and D. There is thus for a given conduction angle, a temperature range within which the thyristor can be operated without failing, it being understood that at temperatures above a specified level, the maximum permissible value of average current decreases. Similarly for a given temperature within a predetermined range (between 85° — 125° C. in the example shown) certain values of average current and conduction angle will permit safe operation while others will give rise to unsafe operation.

It will thus be appreciated that for reliable thyristor operation it is highly desirable to provide means for maintaining the junction temperature of the thyristor at a safe level.

Figure 2:
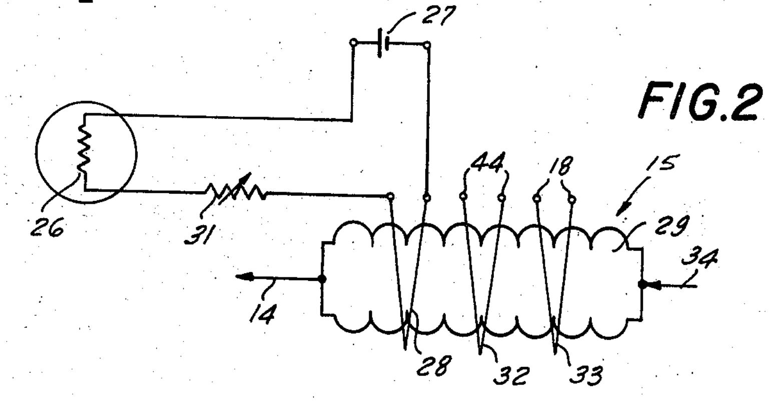
FIG. 2 is a circuit diagram illustrating in detail one section of the circuit of FIG. 1.

In the case of the thyristor whose conduction and temperature characteristics are shown in FIG. 6, the junction temperature temperature must be maintained below 125° C., under all circumstances, and for various operating conditions must be maintained at values below those of the curves A—D. To accomplish this result, in accordance with the present invention, a temperature sensing element 26, such as a thermistor, is in good thermal transfer relation to the thermistor wafer, as by being mounted on the case 20. A thermistor is a device whose resistance changes in known fashion with respect to temperature. In one embodiment of this invention, as shown in FIG. 2, thermistor 26 is a linear temperature sensor having a negative temperature coefficient, i.e. the resistance of thermistor 26 decreases with increasing temperature. Thermistor 26 is connected in series with a DC voltage source 27, a variable resistor 31, and a control winding 28 arranged about the core of a saturable reactor 29. Saturable reactor 29 and its associated control windings such as 28, 32, and 33 form part of the firing circuit 15 of FIG. 1. The feedback signal 18, shown as being applied to control winding 33, under normal conditions provides the operative control of the saturable reactor 29 in a known manner so as to vary the pulsating DC signal constituting the gate control signal fed to the gate by conductor 14.

At normal temperatures, the currents in windings 28 and 32 are too small to affect the operation of firing circuit 15. When, however, the junction temperature of thyristor 11, and thus the temperature of case 20, rises above a predetermined safe level, the resistance value of thermistor 26 will decrease, thus increasing the current in control winding 28 which will gradually take precedence over the feedback signals applied to control winding 33. (The value of resistor 31 is so set as to insure that the current in winding 28 is significant to affect control signal 14 only when the resistance of thermistor 26 is at a level corresponding to an excessive thyristor temperature.)

When a sufficient current is applied through control winding 28 to affect the output signal 14, the phase of the operative output signal of the thyristor 11 is varied (i.e. delayed) to cause a reduction in the conduction angle or gate control, and hence a reduction in the average forward current passing through the thyristor. The reduced forward current in thyristor 11 will lower the junction temperature to an acceptable safe level and will cause a corresponding reduction in the temperature of case 20. The resistance of thermistor 26 will increase in response to the decrease in the case temperature, to tend to reduce the current in control winding 28, thereby to advance the phase of the operation gate control signal. Thus a control system exists whereby the gate control signal 14 and the forward current of thyristor 11 are continuously varied so that the average current and the junction temperature are cooperatively maintained at or below safe operating levels monitored by thermistor 26. The forward current is continuously controlled and varied only when the case temperature exceeds its maximum safe value. When the cause of the thyristor overheating is located and remedied, the control of the gate control voltage is once again returned to the load feedback signal 18.

If desired, an indicator 36, such as a meter, light, or buzzer, may be operatively connected to firing circuit 15 to provide a warning to the operator, showing him when, and with a meter 36 to what extent, the control circuit is operating at a reduced level. The operator is thus made aware of a malfunction in the thyristor cooling system, and is able to make necessary adjustments in the load circuit to compensate for the reduction in load current, and to seek and correct the cause of the malfunction.

The temperature sensed by thermistor 26 is not the actual junction temperature, but is at best a good approximation thereof. It has been found that a more accurate indication of the junction temperature is obtained by deriving a signal proportional to the forward load current, and combining this signal, properly weighted, with the signal from thermistor 26 to modify the action of firing circuit 15.

As shown in FIG. 1, a current transformer 37 has a primary winding 38 and a secondary winding 39. The primary winding 38 is connected in series with thyristor 11 by conductor 42. The winding 38 thus carries the load current from thyristor 11. This load circuit is inductively coupled to secondary winding 39, and is then fed through coupling circuit 43 and conductors 44 to control winding 32 of saturable reactor 29 (FIG. 2). As junction heating is more closely proportional to the RMS value of the load current than the average value of this current, coupling circuit 43 is preferably designed to produce a DC signal proportional to the RMS value of the forward load current.

Figure 3:
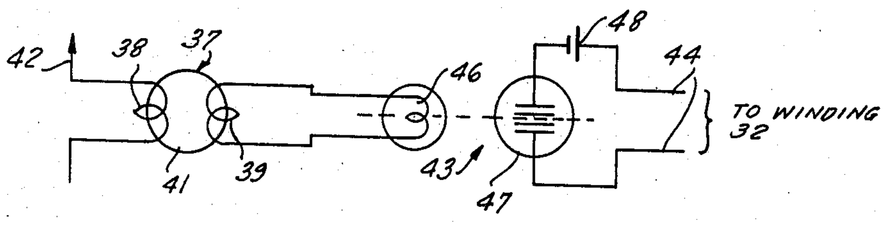
FIGS. 3 and 4 are circuit diagrams illustrating two different ways to provide a signal corresponding to the RMS value of the thyristor forward current.
Figure 4:
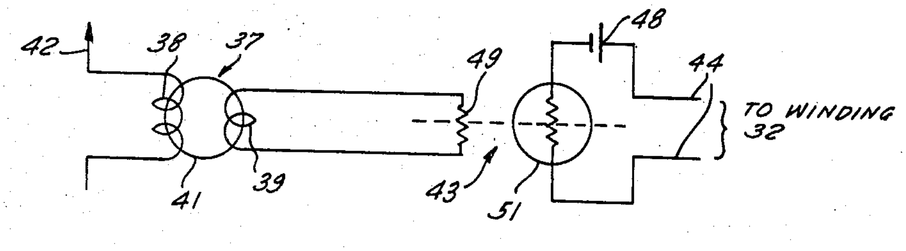

Two embodiments of coupling circuit 43 are illustrated in FIGS. 3 and 4 respectively. In FIG. 3, secondary winding 39 is directly connected to a lamp 46 which is placed in light communication with a photoresistor 47 having a resistance which varies with the intensity of light incident thereon. Photoresistor 47 is connected in series with a DC voltage source such as battery 48. The intensity of lamp 46, the resistance of photoresistor 47, and the DC signal at conductors 44 applied to control winding 32, are all thus proportional to the RMS value of the current flowing in conductor 42.

In the circuit of FIG. 4, the output of secondary winding 39 is applied across fixed resistor 49, thereby to heat the latter. Resistor 49 is positioned in intimate thermal contact with a thermistor 51, the resistance of which is a substantially linear function of the temperature of resistor 49. As a result, the current applied to winding 32 through conductors 44 is once again proportional to the RMS value of the current in conductor 42.

In an exemplary embodiment, it has been found that the relative weighting of the case temperature signals and the load current signals should be in the ratio of approximately 4:1 in order to produce a resultant control very closely corresponding to the actual junction temperature of the thyristor 11. This weighting is largely empirical, and will vary somewhat from one installation to another, depending, for example, upon the nature of the thermal connection between thyristor 11 and thermistor 26.

Another embodiment of the present invention utilizing both case temperature and load current control signals to affect the conduction angle, is illustrated in FIG. 5. The control circuit of FIG. 5 comprises bridge circuits 52 and 53. The bridge circuit 52 contains thermistor 26 in one thereof. Its other arms comprises fixed resistors 54 and 56, and variable resistor 57. The arms of bridge circuit 53 comprise thermistors 58 and 59, a fixed resistor 61 and a variable resistor 62. A stable DC voltage is applied across terminals 63 and 64 of bridge circuit 52, and across terminals 66 and 67 of bridge circuit 53. The DC signal is derived from a stable DC power supply, here shown as comprising a rectifier bridge 68 receiving an AC supply across its input terminals 69. A Zener diode 70 is connected across the output terminals of rectifier bridge 68 to establish a substantially constant DC voltage across leads 71.

Control winding 28, in series with an adjustable resistor 72, is connected across output terminals 73 and 74 of bridge circuit 52, and control winding 32, in series with adjustable resistor 76, is connected across the output terminals 77 and 78 of bridge circuit 53.

Bridge circuit 52 is initially balanced when case 20 is at a safe temperature by varying potentiometer 57 so that substantially no current flows in control winding 28. When the case temperature becomes overheated, the resistance of thermistor 26 is varied, thereby causing bridge 52 to become unbalanced, so that current beings to flow in control winding 28. As described above, the flow of current in control winding 28 will vary the phase of the operative gate control signal generated by saturable reactor 29.

Thermistor 59 is mounted for intimate thermal conduction on conductor 42 (or, as in the embodiment of FIG. 4, on resistor 49) in a manner such that it senses the ohmic heating of conductor 42 (or resistor 49) due to the current passing therethrough. Thermistor 58 is positioned near thyristor 11, but heat shielded therefrom, to provide an accurate indication of the ambient temperature. Bridge circuit 53 is initially balanced by adjusting resistor 62 so that no current flows in control winding 32, for equal resistance values of thermistors 58 and 59. When load current flows in conductor 42 or resistor 49, heat will be generated, thereby varying the resistance of thermistor 59, unbalancing bridge circuit 53, and causing current to flow in control winding 32. This current flow is proportional to the difference between the temperature of conductor 42 (resistor 49) and the ambient temperature, and thus provides a highly accurate indication of the RMS value of the load current, one which is not materially affected by changes in ambient temperature. The desired relative magnitudes of the currents in control windings 28 and 32 are established by a suitable setting of the resistors 72 and 76.

The operation of saturable reactor 29 is thus effectively controlled, when the case temperature becomes excessive, to reduce the level (retard the phase) of the operative gate control signal, and hence the value of the load current, thereby to reduce the junction temperature to an acceptable level.

When the junction temperature returns to a safe level, as when the cooling malfunction is repaired, control of the conduction angle will be once again determined solely by the load conditions.

In a control circuit in which several thyristors are used together in a balanced configuration, it is only necessary to monitor or sense the hottest thyristor in the group. That thyristor will be the one having the highest forward voltage drop, and thus the highest operating temperature.

Thus a control circuit is provided in which the junction temperature of a thyristor is continuously monitored. When that temperature is in a safe area the control circuit of the present invention is inoperative. When that temperature is unsafe under all operative conditions, the thyristor is turned off. However, when that temperature is in a predetermined range which is unsafe under some operating conditions, but safe under other operating conditions, the thyristor is not turned off. Instead the operating conditions are automatically and continuously varied so as to render them safe for the existing temperature, returning them to normal when normal temperature conditions are reestablished. Thus gradual and continuous current control is provided so long as that is possible without destroying the thyristor.

While only a limited number of embodiments of the present invention have been here specifically disclosed, it will be apparent that many variations may be made therein, all within the scope of the invention as defined in the following claims.

I claim:

1. In a control circuit comprising a semiconductor switching device operating in on and off conditions, and means operatively connected to said switching device and effective to produce a control signal for controlling the relative time durations of said on and off conditions of said switching device; the improvement which comprises means operatively connected to said switching device for sensing the temperature thereof, and means connecting said temperature-sensing means and said control signal-producing means and effective, as the sensed temperature of said switching device increases and decreases within a predetermined temperature range, to substantially continuously respectively decrease and increase the time duration of said on condition relative to the time duration of said off condition, and further comprising means for sensing the current flowing through said switching device and means operatively connecting said current sensing means and said signal producing means and effective as the sensed current increases and decreases to correspondingly act to respectively decrease and increase the time duration of said on condition relative to the time duration of said off condition.

2. The circuit of claim 1, in which said switching device is a thyristor having a gate electrode, said control signal from said signal producing means being coupled to said gate electrode.

3. The circuit of claim 2, in which said current-sensing means comprises a light source electrically connected to said thyristor so as to be energized by the output therefrom, and photosensitive means in light communication with said light source and electrically connected to said control signal producing means.

4. The circuit of claim 2, in which said current-sensing means comprises resistor means electrically connected to said thyristor so as to be energized by the output therefrom, means operatively connected to said resistor means for sensing the temperature thereof and producing a signal corresponding thereto, and means connecting said signal to said control signal producing means.

5. In the control circuit of claim 4, means for sensing the ambient temperature and producing a signal corresponding thereto, means for comparing said ambient temperature signal with said resistor means temperature signal and producing a resultant signal, it being said resultant signal which is connected to said control signal producing means.

6. In the control circuit of claim 1, in which said current-sensing means comprises a light source electrically connected to said switching device so as to energized by the output therefrom, and photosensitive means in light communication with said light source and electrically connected to said control signal producing means.

7. The control circuit of claim 1, in which said current-sensing means comprises resistor means electrically connected to said switching device so as to be energized by the output therefrom, means operatively connected to said resistor means for sensing the temperature thereof and producing a signal corresponding thereto, and means connecting said signal to said control signal producing means.

8. In the control circuit of claim 1, means for sensing the ambient temperature and producing a signal corresponding thereto, means for comparing a said ambient temperature signal with said resistor means temperature signal and producing a resultant signal, it being said resultant signal which is connected to said control signal producing means.

9. In the control circuit of claim 1, in which said temperature-sensing means comprises a thermistor.

10. In the control circuit of claim 1, in which said signal-producing means comprises saturable reactor means comprising control winding means, said temperature-sensing means being operatively connected to said control winding means.

11. In the control circuit of claim 1, further comprising means operatively connected to said signal-producing means for indicating the magnitude of said control signal.

12. The control circuit of claim 1, in which the magnitude of the control effect of said current-sensing means is less than that of said temperature means.

13. The control circuit of claim 2, in which the magnitude of the control effect of said current-sensing means is less than that of said temperature-sensing means.